(12) United States Patent
Wen

(10) Patent No.: US 7,822,916 B1
(45) Date of Patent: Oct. 26, 2010

(54) INTEGRATED CIRCUIT SEARCH ENGINE DEVICES HAVING PRIORITY SEQUENCER CIRCUITS THEREIN THAT SEQUENTIALLY ENCODE MULTIPLE MATCH SIGNALS

(75) Inventor: Tingjun Wen, Kanata (CA)

(73) Assignee: NetLogic Microsystems, Inc., Santa Clara, CA (US)

( * ) Notice: Subject to any disclaimer, the term of this patent is extended or adjusted under 35 U.S.C. 154(b) by 430 days.

(21) Appl. No.: 11/554,958

(22) Filed: Oct. 31, 2006

(51) Int. Cl.
*G06F 12/00* (2006.01)

(52) U.S. Cl. ............... 711/108; 711/100; 711/118; 365/49.1; 365/49.18; 370/395.42; 370/395.71; 370/395.72; 370/392

(58) Field of Classification Search ............. 711/100, 711/108, 118; 365/49; 370/395.42, 395.71, 370/395.72, 392
See application file for complete search history.

(56) References Cited

U.S. PATENT DOCUMENTS

| | | | |
|---|---|---|---|
| 5,446,686 A | 8/1995 | Bosnyak et al. | |
| 5,748,070 A | 5/1998 | Priebe et al. | |
| 5,852,569 A | 12/1998 | Srinivasan et al. | |
| 6,044,005 A | 3/2000 | Gibson et al. | |
| 6,137,707 A | 10/2000 | Srinivasan et al. | |
| 6,169,685 B1 | 1/2001 | Gandini et al. | |
| 6,175,513 B1 | 1/2001 | Khanna | |
| 6,175,514 B1 | 1/2001 | Henderson et al. | |
| 6,195,277 B1 | 2/2001 | Sywyk et al. | |
| 6,243,281 B1 | 6/2001 | Pereira | |
| 6,288,922 B1 | 9/2001 | Wong et al. | |
| 6,301,636 B1 | 10/2001 | Schultz et al. | |
| 6,307,798 B1 | 10/2001 | Ahmed et al. | |
| 6,317,350 B1 | 11/2001 | Pereira et al. | |
| 6,381,673 B1 * | 4/2002 | Srinivasan et al. ......... 711/108 |
| 6,392,910 B1 * | 5/2002 | Podaima et al. .......... 365/49.18 |
| 6,490,650 B1 | 12/2002 | Pereira | |
| 6,493,793 B1 | 12/2002 | Pereira et al. | |
| 6,577,519 B1 | 6/2003 | Avramescu | |
| 6,580,652 B2 | 6/2003 | Foss et al. | |
| 6,707,694 B2 | 3/2004 | Regev | |
| 6,717,876 B2 | 4/2004 | Vlasenko et al. | |
| 6,728,124 B1 | 4/2004 | Ichiriu et al. | |
| 6,859,378 B1 | 2/2005 | Lin et al. | |
| 6,924,994 B1 | 8/2005 | Lin et al. | |
| 6,934,172 B2 | 8/2005 | Regev et al. | |
| 6,947,302 B2 | 9/2005 | Regev | |
| 2003/0145178 A1 | 7/2003 | Jiang | |

OTHER PUBLICATIONS

Kun et al., "A Power-Optimized 64-Bit Priority Encoder Utilizing Parallel Priority Look-Ahead," ISCAS 2004, pp. 753-756.
Kakshminarayanan et al, "Algorithms for Advanced Packet Classification with Ternary CAMs," SIGCOMM '05, Aug. 21-26, 2005, Philadelphia, PA, 12 pgs.

* cited by examiner

*Primary Examiner*—Tuan V Thai
*Assistant Examiner*—Zhuo H Li
(74) *Attorney, Agent, or Firm*—Mahamedi Paradice Kreiman LLP; William L. Paradice, III

(57) ABSTRACT

A search engine device includes a lookup circuit, such as a content addressable memory (CAM) array. This lookup circuit is configured to generate multiple active match signals in response to detecting multiple matches between a search operand applied to said lookup circuit and multiple entries therein, during a search operation. A priority sequencer circuit is also provided. This priority sequencer circuit, which is electrically coupled to outputs of the lookup circuit, is configured to sequentially encode each of the multiple active match signals according to priority.

13 Claims, 4 Drawing Sheets

INTEGRATED CIRCUIT SEARCH ENGINE DEVICES HAVING PRIORITY SEQUENCER CIRCUITS THEREIN THAT SEQUENTIALLY ENCODE MULTIPLE MATCH SIGNALS

FIELD OF THE INVENTION

The present invention relates to integrated circuit memory devices and, more particularly, to content addressable memory (CAM) devices.

BACKGROUND OF THE INVENTION

In many memory devices, including random access memory (RAM) devices, data is typically accessed by supplying an address to an array of memory cells and then reading data from the memory cells that reside at the supplied address. However, in content addressable memory (CAM) devices, data within a CAM array is typically not accessed by supplying an address, but rather by applying data (e.g., search words) to the array and then performing a search operation to identify one or more entries within the CAM array that contain data equivalent to the applied data and thereby represent a "match" condition. In this manner, data is typically accessed according to its content rather than its address. Upon completion of the search operation, the identified location(s) containing the equivalent data is typically encoded to provide an address (e.g., block address+row address within a block) at which the matching entry is located. If multiple matching entries are identified in response to the search operation, then local priority encoding operations may be performed to identify a location of a best or highest priority matching entry. Such priority encoding operations frequently utilize the relative physical locations of multiple matching entries within the CAM array to identify a highest priority matching entry. An exemplary CAM device that utilizes a priority encoder to identify a highest priority matching entry is disclosed in commonly assigned U.S. Pat. No. 6,370,613 to Diede et al., entitled "Content Addressable Memory with Longest Match Detect," the disclosure of which is hereby incorporated herein by reference. Additional CAM devices are described in U.S. Pat. Nos. 5,706,224, 5,852,569 and 5,964,857 to Srinivasan et al. and in U.S. Pat. Nos. 6,101,116, 6,256,216, 6,128,207 and 6,262,907 to Lien et al., assigned to the present assignee, the disclosures of which are hereby incorporated herein by reference.

CAM cells are frequently configured as binary CAM cells that store only data bits (as "1" or "0" logic values) or as ternary CAM cells that store data bits and mask bits. As will be understood by those skilled in the art, when a mask bit within a ternary CAM cell is inactive (e.g., set to a logic 1 value), the ternary CAM cell may operate as a conventional binary CAM cell storing an "unmasked" data bit. When the mask bit is active (e.g., set to a logic 0 value), the ternary CAM cell is treated as storing a "don't care" (X) value, which means that all compare operations performed on the actively masked ternary CAM cell will result in a cell match condition. Thus, if a logic 0 data bit is applied to a ternary CAM cell storing an active mask bit and a logic 1 data bit, the compare operation will indicate a cell match condition. A cell match condition will also be indicated if a logic 1 data bit is applied to a ternary CAM cell storing an active mask bit and a logic 0 data bit. Accordingly, if a data word of length N, where N is an integer, is applied to a ternary CAM array having a plurality of entries therein of logical width N, then a compare operation will yield one or more match conditions whenever all the unmasked data bits of an entry in the ternary CAM array are identical to the corresponding data bits of the applied search word. This means that if the applied search word equals {1011}, the following entries will result in a match condition in a CAM comprising ternary CAM cells: {1011}, {X011}, {1X11}, {10X1}, {101X}, {XX11}, {1XX1}, ..., {1XXX}, {XXXX}.

CAM devices may also include multiple match detection circuits that generate a flag to indicate the presence of multiple matching entries when a search operation is performed within a CAM device. For example, FIG. 3 of U.S. Pat. No. 6,175,513 to Khanna illustrates a multiple match detection circuit 10 that uses logic 15 to generate a plurality of intermediate multiple match flags (MM1-MM3). A final multiple match flag (MMF) is generated by logically combining the intermediate multiple match flags using an OR gate. The speed and scalability of the multiple match detection circuits disclosed in the '513 patent may be limited by the fact that each match signal input sees a relatively large fanout. For example, as illustrated by FIGS. 5 and 6A-6E of the '513 patent, a fanout of n (e.g., 5) will be required in a multiple match detection circuit that receives $2^n$ (e.g., 32) match signal inputs. U.S. Pat. Nos. 6,924,994 and 6,859,378 to Lin et al. also disclose CAM devices with multiple match detection circuits therein that are scalable. Additional multiple match detection circuits are disclosed in U.S. Pat. Nos. 5,748,070, 5,852,569, 6,195,277, 6,307,798 and 6,392,910.

SUMMARY OF THE INVENTION

Integrated circuit search engine devices according to embodiments of the present invention include a lookup circuit and a priority sequencer circuit. The lookup circuit is configured to generate multiple active match signals (e.g., a multi-match vector) in response to detecting multiple matches between a search operand (e.g., search key) applied to the lookup circuit and multiple entries stored therein, during a search operation. The lookup circuit may include a content addressable memory (CAM) array and/or other lookup device configured to perform comparisons between operands applied to the lookup device and entries stored therein. The match signals may be generated on match signal lines associated with the lookup circuit.

The priority sequencer circuit, which is electrically coupled to the lookup circuit, is configured to sequentially encode each of the multiple active match signals according to priority. This sequential encoding may result in the generation of a plurality of encoded match vectors from a single search operation and each of these encoded match vectors may be further encoded into a corresponding match address.

According to some of these embodiments of the present invention, the priority sequencer circuit includes a match signal register, a priority encoder and an output register. The match signal register is configured to generate a plurality of pre-encoded match vectors in response to the multiple active match signals generated by the lookup circuit and additional signals generated by the output register. The match signal register may be defined by a plurality of set/reset (SR) latches. The priority encoder is configured to generate a first plurality of encoded match vectors in response to the plurality of pre-encoded match vectors. The output register is configured to sequentially latch a second plurality of encoded match vectors at first outputs thereof, in response to the first plurality of encoded match vectors. This second plurality of encoded match vectors may be true or complementary versions of the first plurality of encoded match vectors. The first outputs of the output register may also be electrically coupled to a plurality of inputs of the match signal register. In particular, the match signal register may be configured to receive the multiple active match signals at first inputs thereof and the first outputs of the output register may be electrically coupled to the second inputs of the match signal register. The search engine device may also include an address encoder, which is electrically coupled to the output register. The address encoder is configured to generate a plurality of match addresses in response to the match vectors generated by the output register.

Still further embodiments of the present invention include an integrated circuit device with a lookup circuit that is configured to generate a multi-match vector, in response to detecting multiple matches between a search operand applied to the lookup circuit during a search operation and entries stored within the lookup circuit. A priority sequencer circuit is also provided, which is electrically coupled to the lookup circuit (e.g., electrically coupled to match lines within the lookup circuit). The priority sequencer circuit is configured to generate a plurality of encoded match vectors in response to the multi-match vector by sequentially feeding back true or complementary versions of the plurality of encoded match vectors from outputs of the priority sequencer circuit to inputs of the priority sequencer circuit.

DETAILED DESCRIPTION OF PREFERRED EMBODIMENTS

Figure 1A:
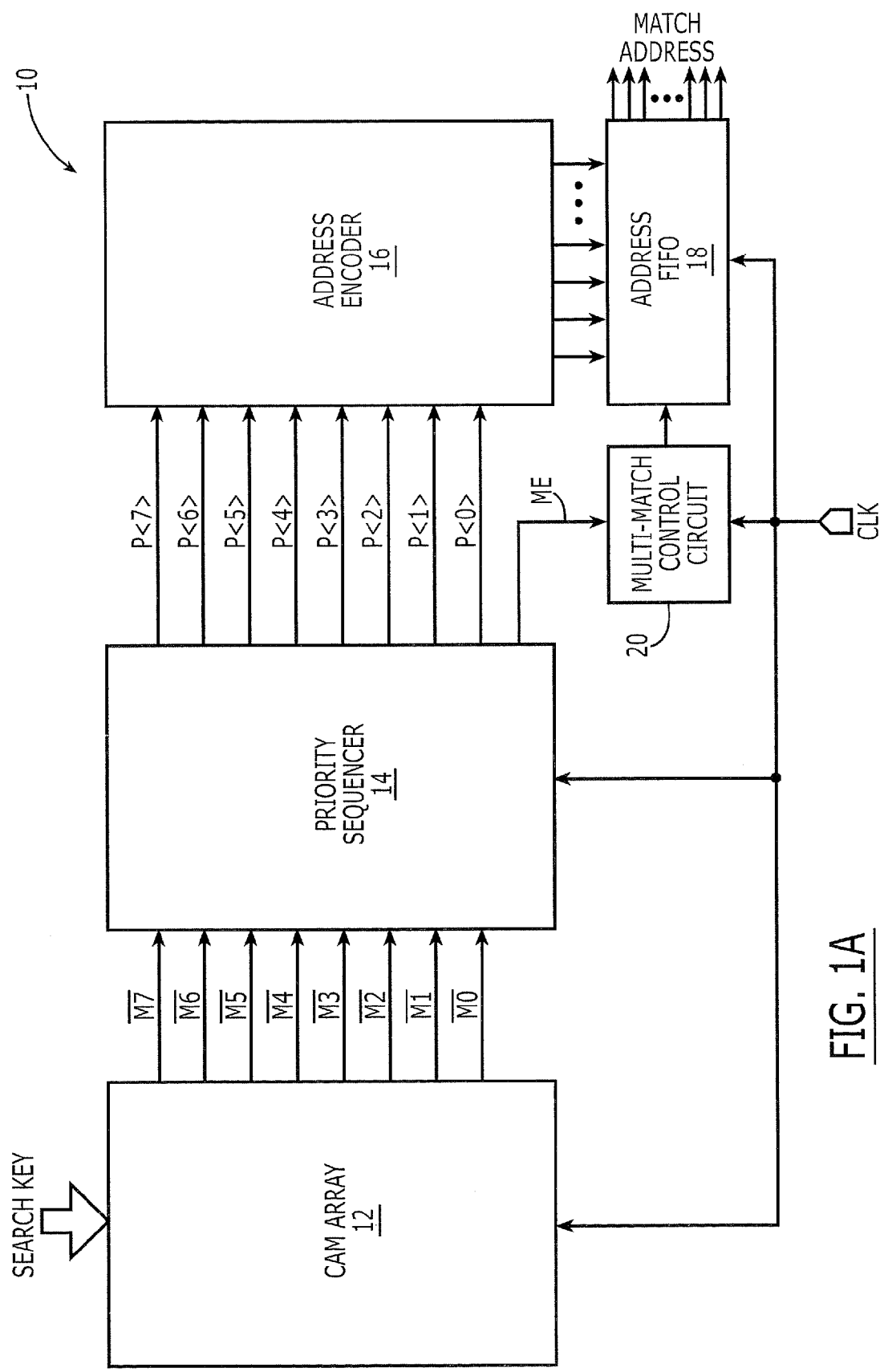
FIG. 1A is a block diagram of an integrated circuit search engine device with priority sequencer circuit, according to embodiments of the present invention.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. The overstrike symbol "¯" (or prefix symbol "/") to a signal name may also denote a complementary data or information signal or an active low control signal, for example.

Integrated circuit search engine devices according to embodiments of the present invention include lookup circuits and priority sequencer circuits. As illustrated by FIG. 1A, one embodiment of a search engine device 10 is illustrated as including a content addressable memory (CAM) array 12, which operates as a lookup circuit. This CAM array 12 is configured to perform a parallel comparison between an applied search operand (SEARCH KEY) and a plurality of internally stored CAM entries during a corresponding search operation. In response to this search operation, the CAM array 12 generates a plurality of match signals. These match signals are typically generated in parallel on corresponding match lines, which may extend from corresponding rows of the CAM array 12. As illustrated by FIG. 1A, the match signals are illustrated as active low match signals: /M0-/M7, which collectively form a multi-bit match vector. For purposes of discussion herein, the entries within the CAM array 12 are arranged row-by-row according to priority, with the match signal /M0 corresponding to the highest priority entry and the match signal /M7 corresponding to the lowest priority entry.

If the CAM array 12 contains multiple entries that match an applied search key during a search operation, then the CAM array 12 will generate multiple active match signals (i.e., multiple logic "0" match signals). These multiple active match signals are provided as inputs to a priority sequencer circuit 14. According to some embodiments of the present invention, whenever a search operation results in the generation of multiple active match signals (i.e., a plurality of match signals /M0-/M7 are set to logic "0" levels), the priority sequencer circuit 14 will sequentially encode each of the multiple active match signals according to priority (e.g., from highest to lowest priority). This sequential encoding will result in the generation of a plurality of encoded multi-bit match vectors P<0:7>, which are passed to an address encoder 16. In response, the address encoder 16, which may be of conventional design, generates addresses that correspond to the plurality of encoded match vectors P<0:7>. In some embodiments of the invention, these addresses may be provided to an address FIFO 18, which sequentially passes the addresses to an address bus (MATCH ADDRESS). This address FIFO 18 may be responsive to an output signal generated by a multi-match control circuit 20, which receives a match exist signal ME from the priority sequencer circuit 14. The CAM array 12, priority sequencer circuit 14, multi-match control circuit 20 and address. FIFO 18 may, in some cases, be synchronized to a common clock signal CLK, as illustrated.

Figure 1B:
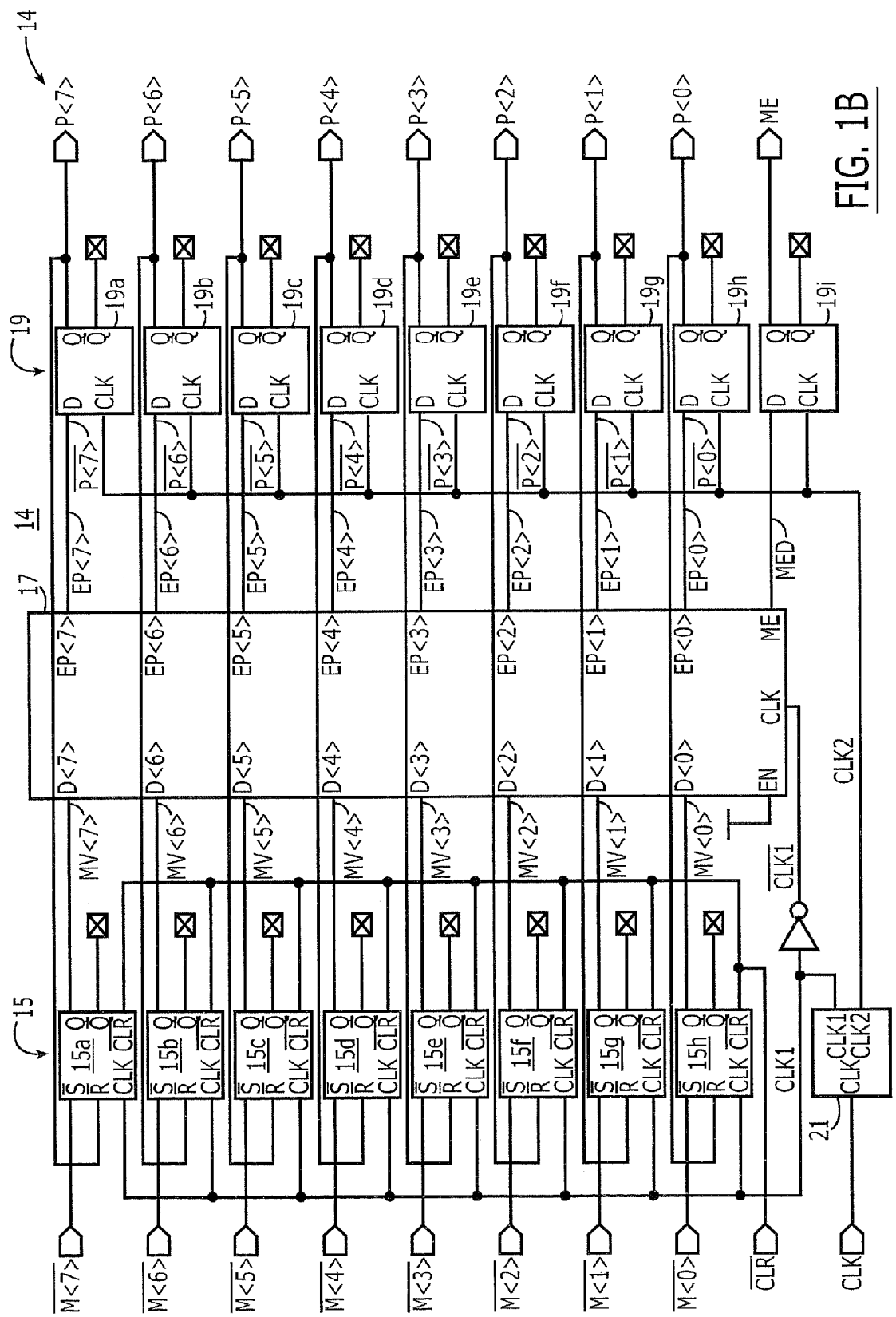
FIG. 1B is an electrical schematic of a priority sequencer circuit, according to embodiments of the present invention.

FIG. 1B illustrates a priority sequencer circuit 14 according to an embodiment of the present invention. This priority sequencer circuit 14 includes a match signal register 15, a priority encoder 17 and an output register 19. The match signal register 15 is configured to generate a plurality of pre-encoded match vectors MV<0:7> whenever the lookup circuit (e.g., CAM array 12) generates multiple active match signals /M<0:7> in response to a search operation and the priority sequencer circuit 14 is enabled to perform sequential encoding. The priority encoder 17 is configured to generate a first plurality of encoded match vectors EP<0:7> in response to the plurality of pre-encoded match vectors MV<0:7>. The output register 19 is configured to sequentially latch a second plurality of encoded match vectors P<0:7> at first outputs thereof (shown as true outputs Q), in response to the first plurality of encoded match vectors EP<0:7>.

In particular, the match signal register 15 includes a plurality of set/reset (SR) latches 15a-15h and the output register 19 includes a plurality of D-type latches 19a-19i. Alternative embodiments of latch elements may also be used. One embodiment of a set/reset latch is illustrated by FIG. 1E and one embodiment of a D-type latch is illustrated by FIG. 1D. Each set/reset latch 15a-15h includes active low set and reset inputs (/S and /R) and true and complementary outputs Q and /Q. The set/reset latches 15a-15h are synchronized by a first clock signal (CLK1) and may be set to a default output condition by operation of an active low clear signal /CLR. This first clock signal CLK1 and a second clock signal CLK2 are generated by a clock generator 21. The second clock signal CLK2 has the same frequency as the first clock signal CLK1, but is delayed by more than 180° relative to the first clock signal CLK1 so that the priority encoder 17, which is responsive to /CLK1, can fully perform its function before the output register 19 is triggered to perform a latching operation. Each D-type latch 19a-19h has a true output Q, which is passed to the address encoder 16 as a corresponding bit of the multi-match vector P<0:7>, and is fed back to a reset input of a corresponding set/reset latch. The additional D-type latch 19i latches a match exist signal ME, which is generated by the priority encoder 17 and passed to the D-type latch 19i on a match exist signal line MED. This match exist signal ME, which reflects a presence or absence of at least one match condition at the data inputs D<0:7> of the priority encoder 17, is passed to the multi-match control circuit 20.

Figure 1C:
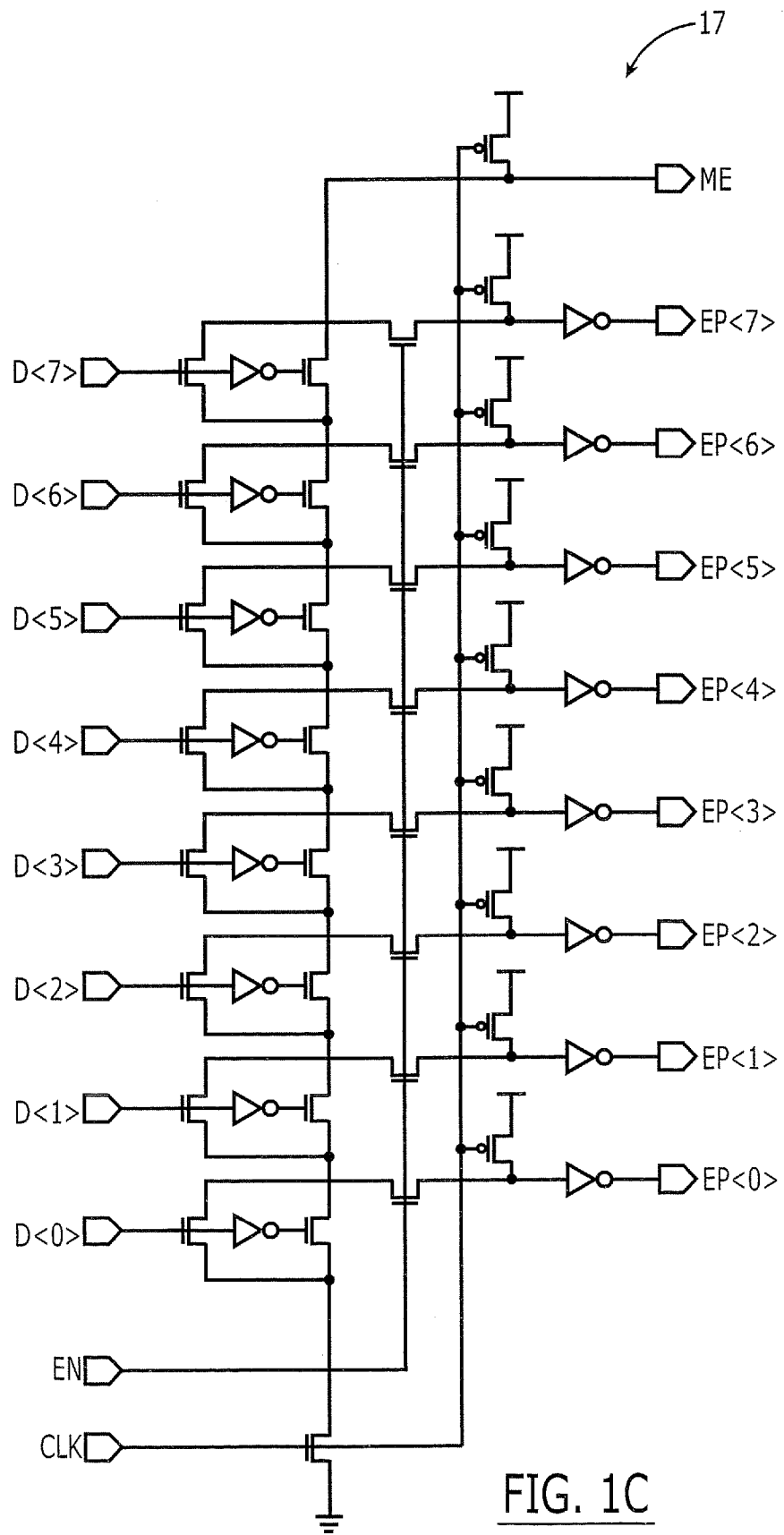
FIG. 1C is an electrical schematic of a priority encoder that may be utilized in the priority sequencer circuit of FIG. 1B.
Figure 1D:
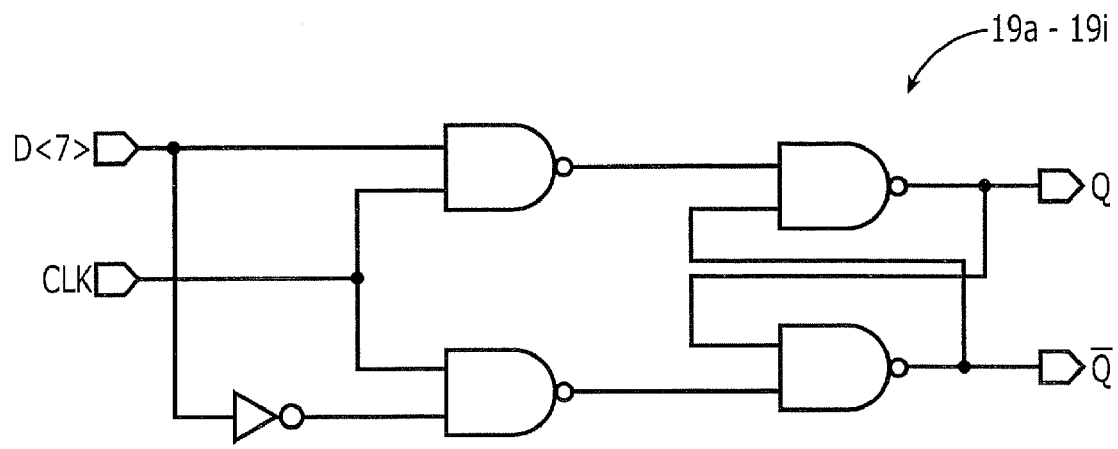
FIG. 1D is an electrical schematic of a D-type flip-flop that may be used in the priority sequencer circuit of FIG. 1B.
Figure 1E:
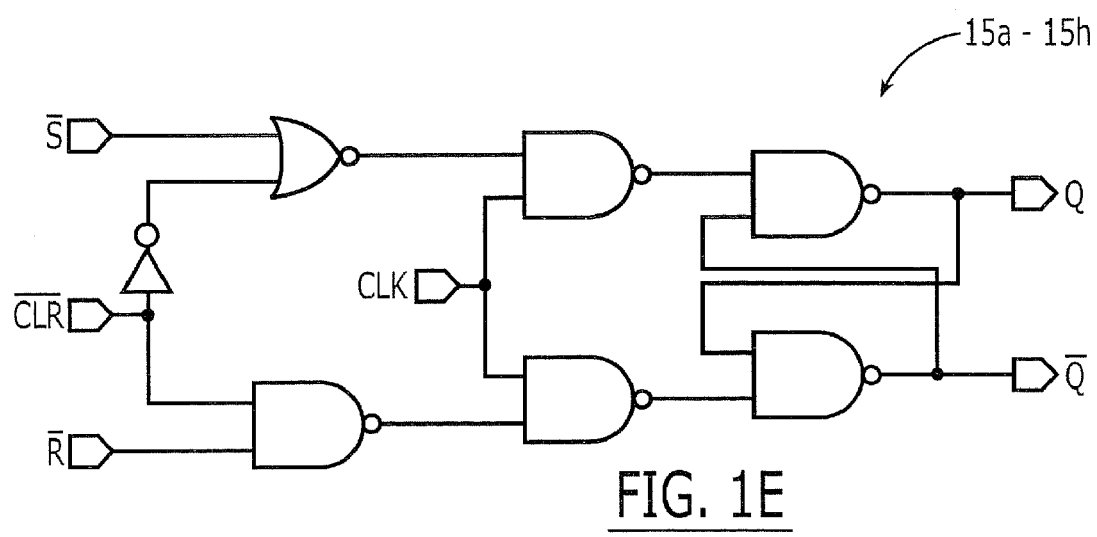
FIG. 1E is an electrical schematic of a set/reset (SR) flip-flop that may be used in the priority sequencer circuit of FIG. 1B.

One embodiment of the priority encoder 17 of FIG. 1C is illustrated in detail by the electrical schematic of FIG. 1C. In particular, the priority encoder 17 of FIG. 1C includes a plurality of PMOS pull-up transistors, which have gate terminals responsive to a clock signal CLK (shown as /CLK1 in FIG. 1B). Based on this configuration, each low-to-high transition of the first clock signal CLK1 (i.e., high-to-low transition of /CLK1) causes the encoded output signals EP<0:7> and the match exist signal ME to be driven low (by inverters) to logic 0 levels. Thereafter, whenever the first clock signal CLK1 switches high-to-low and the enable signal EN is set to a logic 1 level, the priority encoder 17 performs a combinational logic operation to encode each pre-encoded match vector MV<0:7> provided by the match signal register 15. This combinational logic, which include NMOS pass transistors and inverters, performs the highest priority encoding operations illustrated by TABLE 1, where "X" represents a don't care value (0 or 1). The match exist signal ME is switched high-to-low only when D<0:7>=00000000 during a combinational logic operation. Some of these operations are described in an article by C. Kun et al., entitled "A Power-Optimized 64-Bit Priority Encoder Utilizing Parallel Priority Look-Ahead," Proceedings of the International Symposium on Circuits and Systems, May 2004, pp. 753-756.

which is treated herein as an invalid operation, can be avoided by operating the CAM array 12 so that each valid match vector /M<0:7> generated in response to a search operation is switched back to a precharged condition (i.e., /M<0:7>=11111111) within one cycle of CLK1, after being latched by the match signal register 15 at the commencement of the sequential encoding operations.

TABLE 2

| CLK | /CLR | /S | /R | $Q_{n+1}$ | $/Q_{n+1}$ | Comment |
|---|---|---|---|---|---|---|
| 0 | 0 | 0 | 0 | $Q_n$ | $/Q_n$ | Hold |
| 0 | 0 | 0 | 1 | $Q_n$ | $/Q_n$ | Hold |
| 0 | 0 | 1 | 0 | $Q_n$ | $/O_n$ | Hold |
| 0 | 0 | 1 | 1 | $Q_n$ | $IQ_n$ | Hold |
| 0 | 1 | 0 | 0 | $Q_n$ | $/Q_n$ | Hold |
| 0 | 1 | 0 | 1 | $Q_n$ | $/Q_n$ | Hold |
| 0 | 1 | 1 | 0 | $Q_n$ | $/Q_n$ | Hold |
| 0 | 1 | 1 | 1 | $Q_n$ | $/Q_n$ | Hold |
| 1 | 0 | 0 | 0 | 0 | 1 | Clear |
| 1 | 0 | 0 | 1 | 0 | 1 | Clear |
| 1 | 0 | 1 | 0 | 0 | 1 | Clear |
| 1 | 0 | 1 | 1 | 0 | 1 | Clear |
| 1 | 1 | 0 | 0 | 1 | 1 | Invalid |
| 1 | 1 | 0 | 1 | 1 | 0 | Set |
| 1 | 1 | 1 | 0 | 0 | 1 | Reset |
| 1 | 1 | 1 | 1 | $Q_n$ | $/Q_n$ | Hold |

The outputs ME and EP<0:7> of the priority encoder 17 are provided to the output register 19, which is illustrated as including an array of D-type latches 19a-19i. One embodiment of a D-type latch is illustrated by FIG. 1D, which contains a conventional arrangement of NAND gates and an inverter. Each of these D-type latches 19a-19i operates according to the following truth table (TABLE 3):

TABLE 3

| CLK | D | $Q_{n+1}$ | $/Q_{n+1}$ | Comment |
|---|---|---|---|---|
| 0 | 0 | $Q_n$ | $/Q_n$ | HOLD |
| 0 | 1 | $Q_n$ | $/Q_n$ | HOLD |

TABLE 1

| | | | | | | | | |
|---|---|---|---|---|---|---|---|---|
| CASE 1 | D0 = 1 | D1 = X | D2 = X | D3 = X | D4 = X | D5 = X | D6 = X | D7 = X |
| | EP0 = 1 | EP1 = 0 | EP2 = 0 | EP3 = 0 | EP4 = 0 | EP5 = 0 | EP6 = 0 | EP7 = 0 |
| CASE 2 | D0 = 0 | D1 = 1 | D2 = X | D3 = X | D4 = X | D5 = X | D6 = X | D7 = X |
| | EP0 = 0 | EP1 = 1 | EP2 = 0 | EP3 = 0 | EP4 = 0 | EP5 = 0 | EP6 = 0 | EP7 = 0 |
| CASE 3 | D0 = 0 | D1 = 0 | D2 = 1 | D3 = X | D4 = X | D5 = X | D6 = X | D7 = X |
| | EP0 = 0 | EP1 = 0 | EP2 = 1 | EP3 = 0 | EP4 = 0 | EP5 = 0 | EP6 = 0 | EP7 = 0 |
| CASE 4 | D0 = 0 | D1 = 0 | D2 = 0 | D3 = 1 | D4 = X | D5 = X | D6 = X | D7 = X |
| | EP0 = 0 | EP1 = 0 | EP2 = 0 | EP3 = 1 | EP4 = 0 | EP5 = 0 | EP6 = 0 | EP7 = 0 |
| CASE 5 | D0 = 0 | D1 = 0 | D2 = 0 | D3 = 0 | D4 = 1 | D5 = X | D6 = X | D7 = X |
| | EP0 = 0 | EP1 = 0 | EP2 = 0 | EP3 = 0 | EP4 = 1 | EP5 = 0 | EP6 = 0 | EP7 = 0 |
| CASE 6 | D0 = 0 | D1 = 0 | D2 = 0 | D3 = 0 | D4 = 0 | D5 = 1 | D6 = X | D7 = X |
| | EP0 = 0 | EP1 = 0 | EP2 = 0 | EP3 = 0 | EP4 = 0 | EP5 = 1 | EP6 = 0 | EP7 = 0 |
| CASE 7 | D0 = 0 | D1 = 0 | D2 = 0 | D3 = 0 | D4 = 0 | D5 = 0 | D6 = 1 | D7 = X |
| | EP0 = 0 | EP1 = 0 | EP2 = 0 | EP3 = 0 | EP4 = 0 | EP5 = 0 | EP6 = 1 | EP7 = 0 |
| CASE 8 | D0 = 0 | D1 = 0 | D2 = 0 | D3 = 0 | D4 = 0 | D5 = 0 | D6 = 0 | D7 = 1 |
| | EP0 = 0 | EP1 = 0 | EP2 = 0 | EP3 = 0 | EP4 = 0 | EP5 = 0 | EP6 = 0 | EP7 = 1 |

The match signal register 15 is illustrated as including an array of set/reset latches 15a-15h. One embodiment of the set/reset latch is illustrated by FIG. 1E, which contains an arrangement of NAND gates, NOR gates and an inverter, connected as illustrated. Each of these set/reset latches operates according to the following truth table (TABLE 2). The operations illustrated by the truth table are conventional. Nonetheless, the case where CLK=/CLR=1 and /S=/R=0, TABLE 3-continued

| CLK | D | $Q_{n+1}$ | $/Q_{n+1}$ | Comment |
|---|---|---|---|---|
| 1 | 0 | 0 | 1 | $Q_{n+1}$ = D |
| 1 | 1 | 1 | 0 | $Q_{n+1}$ = D |

Operations of the priority sequencer circuit 14 will now be described more fully with respect to the following sequential encoding example. In this example, a single multi-match vector /M<0:7> generated by the CAM array 12 during a search operation will be treated as /M<0:7>=01010101, which signifies four matches with an applied search operand (i.e., four "0" match signals are present). In response, the match signal register 15, which has previously undergone a clear operation by temporarily setting /CLR=0 during a prior clock cycle, will generate a first pre-encoded match vector as MV<0:7>=10101010 in-sync with a low-to-high transition of the clock signal CLK1. The multi-match vector /M<0:7> is then set to /M<0:7>=11111111 by the CAM array 12 (before the next low-to-high transition of the clock signal CLK1).

Immediately following the generation of the first pre-encoded match vector as MV<0:7>=10101010, the next high-to-low transition of the clock signal CLK1, which corresponds to a low-to-high transition of the clock signal /CLK1, will cause the priority encoder 17 to generate an encoded match vector EP<0:7>=10000000, with only one set bit. The match exist signal ME will remain at a logic 1 level to reflect the presence of at least one match condition. Thereafter, the encoded match vector EP<0:7>=10000000 will be passed (and latched) by the output register 19 in-sync with the immediately following low-to-high transition of the clock signal CLK2. This latching event results in the generation of the following match vector P<0:7>=10000000, which is passed to the address encoder 16. The address encoder 16 can perform a conventional encoding operation to thereby generate an address corresponding to the highest priority matching entry with the CAM array 12. The address FIFO 18 stores this address for subsequent communication to the address bus (MATCH ADDRESS) in response to signals generated by the control circuit 20.

The match vector P<0:7>=10000000 is also fed back to the active low reset inputs (/R) of the match signal register 15. Following this, the next low-to-high transition of the clock signal CLK1 causes a second pre-encoded match vector MV<0:7>=00101010 to be generated. The next high-to-low transition of the clock signal CLK1, which corresponds to a low-to-high transition of the clock signal /CLK1, will cause the priority encoder 17 to generate a second encoded match vector EP<0:7>=00100000, with the match exist signal ME remaining at a logic 1 level to reflect the presence of at least one match condition. Thereafter, the second encoded match vector EP<0:7>=00100000 will be passed (and latched) by the output register 19 in-sync with the immediately following low-to-high transition of the clock signal CLK2. This latching event results in the generation of the following second match vector P<0:7>=00100000, which is passed to the address encoder 16. The address encoder 16 can perform a conventional encoding operation to thereby generate a second address corresponding to the second highest priority matching entry with the CAM array 12. The address FIFO 18 stores this second address for subsequent communication to the address bus in response to signals generated by the control circuit 20.

The match vector P<0:7>=00100000 is also fed back to the active low reset inputs (/R) of the match signal register 15. Following this, the next low-to-high transition of the clock signal CLK1 causes a third pre-encoded match vector MV<0:7>=00001010 to be generated. The next immediate high-to-low transition of the clock signal CLK1, which corresponds to a low-to-high transition of the clock signal /CLK1, will cause the priority encoder 17 to generate a third encoded match vector EP<0:7>=00001000, with the match exist signal ME remaining at a logic 1 level to reflect the presence of at least one match condition. Thereafter, the third encoded match vector EP<0:7>=00001000 will be passed (and latched) by the output register 19, in-sync with the immediately following low-to-high transition of the clock signal CLK2. This latching event results in the generation of the following third match vector P<0:7>=00001000, which is passed to the address encoder 16. The address encoder 16 can perform a conventional encoding operation to thereby generate a third address corresponding to the third highest priority matching entry with the CAM array 12. The address FIFO 18 stores this third address for subsequent communication to the address bus in response to signals generated by the control circuit 20.

The match vector P<0:7>=00001000 is also fed back to the active low reset inputs (/R) of the match signal register 15. Following this, the next low-to-high transition of the clock signal CLK1 causes a fourth pre-encoded match vector MV<0:7>=00000010 to be generated. The next immediate high-to-low transition of the clock signal CLK1, which corresponds to a low-to-high transition of the clock signal /CLK1, will cause the priority encoder 17 to generate a fourth encoded match vector EP<0:7>=00000010, with the match exist signal ME remaining at a logic 1 level to reflect the presence of at least one match condition. Thereafter, the fourth encoded match vector EP<0:7>=00000010 will be passed (and latched) by the output register 19 in-sync with the immediately following low-to-high transition of the clock signal CLK2. This latching event results in the generation of the following fourth match vector P<0:7>=00000010, which is passed to the address encoder 16. The address encoder 16 can perform a conventional encoding operation to thereby generate a fourth address corresponding to the fourth (and final) highest priority matching entry with the CAM array 12. The address FIFO 18 stores this fourth address for subsequent communication to the address bus in response to signals generated by the control circuit 20.

The fourth match vector P<0:7>=00000010 is also fed back to the active low reset inputs (/R) of the match signal register 15. Following this, the next low-to-high transition of the clock signal CLK1 causes a fourth pre-encoded match vector MV<0:7>=00000000 to be generated. The next immediate high-to-low transition of the clock signal CLK1, which corresponds to a low-to-high transition of the clock signal /CLK1, will cause the priority encoder 17 to generate a fourth encoded match vector EP<0:7>=00000000, with the match exist signal ME switching high-to-low to reflect the absence of any remaining match condition. This high-to-low transition of the match exist signal ME is passed to the control circuit 20, which may then generate a signal to the address FIFO so that the address bus (MATCH ADDRESS) can be reset to a default condition. Thereafter, the final encoded match vector EP<0:7>=00000000 will be passed (and latched) by the output register 19 in-sync with the immediately following low-to-high transition of the clock signal CLK2. This latching event results in the generation of the following final match vector P<0:7>=00000000, which is passed to the address encoder 16, which takes no action. The final match vector P<0:7>=00000000 is also fed back to the active low reset inputs of the match signal register 15 to thereby enable processing of a next multi-match vector from CAM array 12, if any, in response to a corresponding search operation.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:
a lookup circuit configured to generate multiple active match signals in response to detecting multiple matches between a search operand applied to said lookup circuit during a search operation and entries stored within said lookup circuit; and
a priority sequencer circuit electrically coupled to said lookup circuit, said priority sequencer circuit configured to sequentially encode each of the multiple active match signals according to priority, wherein said priority sequencer circuit comprises:
a match signal register configured to generate a plurality of pre-encoded match vectors in response to the multiple active match signals generated by said lookup circuit, wherein each of the plurality of pre-encoded match vectors indicates one or more matches between the search operand and the entries stored within said lookup circuit;
a priority encoder configured to generate a first plurality of encoded match vectors by selectively filtering the plurality of pre-encoded match vectors based on a priority associated with each of the one or more matches; and
an output register configured to sequentially latch a second plurality of encoded match vectors at first outputs thereof in response to the first plurality of encoded match vectors, wherein each of the second plurality of encoded match vectors indicates a match between the search operand and a respective one of the entries stored within said lookup circuit.

2. The device of claim 1, wherein said priority sequencer circuit is configured to sequentially encode each of the multiple active match signals by sequentially generating a plurality of encoded match vectors therefrom.

3. The device of claim 1, further comprising:
an address encoder electrically coupled to the first outputs of said output register, said address encoder configured to generate a plurality of match addresses in response to the second plurality of encoded match vectors.

4. The device of claim 1, wherein said priority sequencer circuit is configured to electrically couple a plurality of outputs of said output register to a plurality of inputs of said match signal register.

5. The device of claim 4, wherein said match signal register comprises a plurality of set/reset (SR) latches.

6. The device of claim 1, wherein said priority sequencer circuit is configured to feed back true or complementary versions of the first plurality of encoded match vectors from said output register to said match signal register.

7. The device of claim 1, wherein said match signal register is configured to receive the multiple active match signals at first inputs thereof; and wherein said priority sequencer circuit is configured to feed back complementary versions of the second plurality of encoded match vectors from outputs of said output register to second inputs of said match signal register.

8. The device of claim 7, wherein said match signal register comprises a plurality of set/reset (SR) latches; wherein set terminals of the plurality of set/reset (SR) latches operate as the first inputs of said match signal register; and wherein reset terminals of the plurality of set/reset (SR) latches operate as second inputs of said match signal register.

9. An integrated circuit device, comprising:
a lookup circuit configured to generate a multi-match vector in response to detecting multiple matches between a search operand applied to said lookup circuit during a search operation and entries stored within said lookup circuit; and
a priority sequencer circuit electrically coupled to said lookup circuit, said priority sequencer circuit configured to sequentially generate a plurality of encoded match vectors in response to the multi-match vector by feeding back true or complementary versions of the plurality of encoded match vectors from outputs of said priority sequencer circuit to inputs of said priority sequencer circuit, wherein said priority sequencer circuit comprises:
a match signal register configured to generate a plurality of pre-encoded match vectors in response to the multi-match vector, wherein each of the plurality of pre-encoded match vectors indicates one or more matches between the search operand and the entries stored within said lookup circuit;
a priority encoder configured to generate the plurality of encoded match vectors by selectively filtering the plurality of pre-encoded match vectors based on a priority associated with each of the one or more matches; and
an output register configured to sequentially latch the plurality of encoded match vectors, wherein each of the plurality of encoded match vectors indicates a match between the search operand and a respective one of the entries stored within said lookup circuit.

10. The device of claim 9, further comprising:
an address encoder electrically coupled to the first outputs of said output register, said address encoder configured to generate a plurality of match addresses in response to true or complementary versions of the latched first plurality of encoded match vectors.

11. The device of claim 9, wherein said match signal register comprises a plurality of set/reset (SR) latches.

12. The device of claim 9, wherein said match signal register is configured to receive the multi-match vector at first inputs thereof; and wherein said priority sequencer circuit is configured to feed back true or complementary versions of the latched first plurality of encoded match vectors to second inputs of said match signal register.

13. The device of claim 12, wherein said match signal register comprises a plurality of set/reset (SR) latches; wherein set terminals of the plurality of set/reset (SR) latches operate as the first inputs of said match signal register; and wherein reset terminals of the plurality of set/reset (SR) latches operate as second inputs of said match signal register.

* * * * *